(12) United States Patent
Sohn et al.

(10) Patent No.: US 9,133,393 B2
(45) Date of Patent: Sep. 15, 2015

(54) OXYNITRIDE-BASED PHOSPHOR

(75) Inventors: Kee Sun Sohn, Suncheon-si (KR); Un Bae Park, Suncheon-si (KR); Nam Soo Shin, Pohang-si (KR)

(73) Assignee: INDUSTRY-ACADEMY COPERATION CORPS OF SUNCHON NATIONAL UNIVERSITY, Jeollanam-Do (KR)

( * ) Notice: Subject to any disclaimer, the term of this patent is extended or adjusted under 35 U.S.C. 154(b) by 158 days.

(21) Appl. No.: 13/876,847

(22) PCT Filed: Jan. 6, 2012

(86) PCT No.: PCT/KR2012/000163
§ 371 (c)(1),
(2), (4) Date: Mar. 28, 2013

(87) PCT Pub. No.: WO2012/134043
PCT Pub. Date: Oct. 4, 2012

(65) Prior Publication Data
US 2013/0181164 A1 Jul. 18, 2013

(30) Foreign Application Priority Data
Mar. 29, 2011 (KR) .......................... 10-2011-0027932

(51) Int. Cl.
*C09K 11/55* (2006.01)
*C09K 11/77* (2006.01)
(Continued)

(52) U.S. Cl.
CPC ......... *C09K 11/7786* (2013.01); *C09K 11/0883* (2013.01); *C09K 11/7703* (2013.01); *C09K 11/7768* (2013.01); *C09K 11/7787* (2013.01); *H01L 33/502* (2013.01)

(58) Field of Classification Search
USPC ....................... 252/301.4 F, 301.6 F
See application file for complete search history.

(56) References Cited

U.S. PATENT DOCUMENTS 6,284,156 B1 9/2001 Uehara et al.
2009/0206729 A1 8/2009 Kim et al.
(Continued)

FOREIGN PATENT DOCUMENTS

JP 2000-212556 A 8/2008
JP 2008-189811 A 8/2008
(Continued)

OTHER PUBLICATIONS

Atsuro Yaguchi et al., "One-Step Preparation of Blue-Emitting (La,Ca)Si3(O,N)s:Ce3+ Phosphors for High-Color Rendering White Light-Emitting Diodes", Applied Physics Express 4 (2011) 022101.

*Primary Examiner* — Carol M Koslow
(74) *Attorney, Agent, or Firm* — Revolution IP, PLLC

(57) ABSTRACT

Disclosure relates to a phosphor formed by using oxynitride having a good durability and possibly emits diverse color of light from green to yellow when using a blue emitting diode or a ultraviolet emitting diode as an excitation source. The phosphor includes a host material represented by the general formula of $(Ca_{1-x}M1_x)_a(La_{1-y}M2_y)_b Si_c N_d O_e$ (in which $0.5 \leq b/a \leq 7$, $1.5 \leq c/(a+b) \leq 3.5$, $1 \leq d/c \leq 1.8$, $0.6 \leq e/(a+b) \leq 2$, $0 \leq x \leq 0.5$, and $0 \leq y \leq 0.5$) and having a monoclinic crystalline structure, and at least one dissolved activator selected from the group consisting of Mn, Ce, Pr, Nd, Sm, Eu, Gd, Dy, Tb, Ho, Er, Tm and Yb. M1 is at least one element selected from Ba, Mg, Sr, Mn and Zn, and M2 being at least one element selected from Y, Lu, Sc, Gd, Tb, Ce, Nd, Sm, Dy, Ho, Er, Tm, Yb, Al, Ga, Ge, Sn and In.

7 Claims, 4 Drawing Sheets

(51) Int. Cl.
*C09K 11/78* (2006.01)
*C09K 11/79* (2006.01)
*C09K 11/08* (2006.01)
*H01L 33/50* (2010.01)

(56) References Cited

U.S. PATENT DOCUMENTS

2009/0309485 A1 12/2009 Tamaki et al.
2010/0085728 A1* 4/2010 Seto et al. ................ 362/84
2011/0109221 A1* 5/2011 Kim et al. ................ 313/503
2012/0256533 A1* 10/2012 Seto et al. ................ 313/498

FOREIGN PATENT DOCUMENTS

| JP | 2008-195779 A | | 8/2008 |
| KR | 10-0793463 B1 | | 1/2008 |
| KR | 10-0961342 B1 | | 6/2010 |
| WO | WO 2008/132954 | * | 11/2008 |
| WO | WO 2010/114061 | * | 10/2010 |

\* cited by examiner

OXYNITRIDE-BASED PHOSPHOR

CROSS REFERENCE TO PRIOR APPLICATIONS

This application is a National Stage Application of PCT International Patent Application No. PCT/KR2012/000163 filed on Jan. 6, 2012, under 35 U.S.C. §371, which claims priority to Korean Patent Application No. 10-2011-0027932 filed on Mar. 29, 2011, which are all hereby incorporated by reference in their entirety.

TECHNICAL FIELD

The present invention relates to a phosphor having a novel crystalline structure, and more particularly, to a novel oxynitride-based phosphor including oxynitride having a good durability, possibly emitting diverse colors from green to yellow when using a blue emitting diode or a ultraviolet emitting diode as an excitation source, and appropriately applicable for replacing or complementing a SIALON phosphor, in particular.

BACKGROUND ART

A white LED light emitting apparatus recently getting the limelight as a lighting, an LCD backlight, an automobile light, and the like, commonly includes an LED light emitting device emitting blue or near ultraviolet light and a phosphor transforming wavelengths into visible light by using the emitted light from the light emitting device as an excitation source.

In one method for realizing the white LED, a blue light emitting diode using InGaN-based material having a wavelength of 450 to 550 nm is used as a light emitting device, and a yellow light emitting YAG-based phosphor represented by the empirical formula of $(Y,Gd)_3(Al,Ga)_5O_{12}$ is used as a phosphor.

In the white LED, the blue light emitted from the light emitting device is incident to a phosphor layer, and absorption and reflection of the light are repeated for several times by the phosphor layer. The absorbed blue light by the phosphor may be transformed into yellow light. The transformed yellow light and a portion of the incident blue light are mixed and appreciated as white light through the eyes of a viewer.

However, the white LED having the above-described structure includes a small amount of red component in the light, has a high color temperature, and lacks of red and green components. Thus, only lightings having deteriorated color rendering properties may be obtained.

In addition, an oxide-based phosphor generally tends to decrease light intensity when the wavelength of the excitation source exceeds 400 nm. In this case, a highly luminescent white light may not be obtained by using the blue light.

Accordingly, an oxynitride-based phosphor having stability better or equal to that of the oxide phosphor and having a good light emitting efficiency at an excitation source exceeding 400 nm attracts much concern in the white LED field, recently. In addition, since the oxynitride-based phosphor has been originally developed as engineering ceramics, the efficiency decrease and color change due to humidity and heat are small.

However, the presence of the oxynitride-based phosphor in a component region deviated from a-type or R-type sialon (Si—Al—O—N) is little known.

DISCLOSURE OF THE INVENTION

Technical Problem

The purpose of the present invention is to provide a phosphor made by using oxynitride, having a good structural stability, having a good light emitting luminance particularly at yellow color, deviated from the component region of a common sialon phosphor, having a novel crystalline structure for easily improving the light emitting luminance, and being appropriately used in an LED field.

Technical Solution

According to the researches by the present inventors on a novel phosphor composition made by using oxynitride, having structural stability, good durability and good luminance properties, and so, applicable as a phosphor for a lighting such as a white LED, an oxynitride including Ca, La and Si and having a certain composition is found to form a monoclinic inorganic crystalline structure, and a phosphor having the inorganic crystalline structure as a host material may emit light from green to yellow with a high luminance. The crystalline structure of the oxynitride-based phosphor according to the present invention differs from well known other nitridosilicate such as $SrSi_2N_2O_2$ and $\alpha$-/$\beta$-SIALON phosphors.

According to one aspect of the present invention, an oxynitride-based phosphor including a host material represented by the general formula of $(Ca_{1-x}M1_x)_a(La_{1-y}M2_y)_bSi_cN_dO_e$ (in which $0.5 \leq b/a \leq 7$, $1.5 \leq c/(a+b) \leq 3.5$, $1 \leq d/c \leq 1.8$, $0.6 \leq e/(a+b) \leq 2$, $0 \leq x \leq 0.5$, and $0 \leq y \leq 0.5$) and having a monoclinic crystalline structure, and at least one dissolved activator selected from the group consisting of Mn, Ce, Pr, Nd, Sm, Eu, Gd, Dy, Tb, Ho, Er, Tm and Yb is provided. The M1 is at least one element selected from Ba, Mg, Sr, Mn and Zn, and the M2 is at least one element selected from Y, Lu, Sc, Gd, Tb, Ce, Nd, Sm, Dy, Ho, Er, Tm, Yb, Al, Ga, Ge, Sn and In.

In the phosphor according to the present invention, the relation of a, b and c may be defined by a triple element composition designating diagram in FIG. 4.

In the oxynitride-based phosphor according to the present invention, the host material may include a phase illustrating diffraction peaks in ranges of Bragg angles (2θ) of 10.68° to 11.41°, 18.52° to 19.46°, 31.58° to 31.21° and 36.81° to 37.49°, as a representative phase, and the peaks of the representative phase have relative intensity of greater than or equal to 5% when the relative intensity of the most intensive diffraction peak in a powder X-ray diffraction pattern by Co Kα line is 100%. The crystalline structure of the representative phase may be monoclinic.

In the oxynitride-based phosphor according to the present invention, the host material may have a reference value of a crystalline lattice according to peaks of the powder X-ray diffraction pattern of a=18.5427 Å, b=4.8404 Å, c=10.7007 Å, α=γ=90°, β=108.257°, and the changes of a, b, c and β values from the reference value may be less than or equal to ±5%.

In addition, the oxynitride-based phosphor according to the present invention may have the following composition represented by the following [Equation 1].

$$(Ca_{1-x}M1_x)_{a-z}(La_{1-y}M2_y)_bSi_cN_dO_e:M3_z \quad \text{[Equation 1]}$$

Here, $0.55 \leq b/a \leq 7$, $1.5 \leq c/(a+b) \leq 3.5$, $1 \leq d/c \leq 1.8$, $0.6 \leq e/(a+b) \leq 2$, $0 \leq x \leq 0.5$, $0 \leq y \leq 0.5$, and $0.001a \leq z \leq 0.4a$, the M1 is at least one element selected from Ba, Mg, Sr, Mn and Zn, the M2 is at least one element selected from Y, Lu, Sc, Gd, Tb, Ce, Nd, Sm, Dy, Ho, Er, Tm, Yb, Al, Ga, Ge, Sn and In, and the M3 is at least one element selected from Mn, Ce, Pr, Nd, Sm, Eu, Gd, Dy, Tb, Ho, Er, Tm and Yb.

In [Equation 1], the a may be 1 to 30, the b may be 0.8a to 2a, and the c may be 1.8(a+b) to 3.2(a+b).

In [Equation 1], the M3 may include Eu.

In [Equation 1], the x may be 0 to 0.1 and the y may be 0 to 0.1.

In [Equation 1], the z may be 0.001 to 0.1, and more preferably, 0.03 to 0.07.

In addition, the phosphor according to the present invention may emit light of 500 to 600 nm wavelength by the radiation of an excitation source having 360 to 500 nm wavelength.

Advantageous Effects

A phosphor composition based on Ca, La, Si, 0 and N and having a monoclinic crystalline structure as in the present invention has not been reported until now. The composition may be used as blue, greenish yellow and yellow phosphors when doped with Eu, Ce, Mn and the like. Particularly, the light efficiency of the phosphor is good particularly when doped with Eu, and the Eu doped phosphor may be appropriately used as the phosphor for the LED.

Since the phosphor of the present invention is formed by using oxynitride and has good structural stability, the stability in an environment including an oxidation atmosphere or humidity is good. In addition, a radiationless deactivation by which excited electrons emit heat to come back to a ground state, is restrained. Thus, the light emitting efficiency may be increased and good luminance properties may be obtained.

In addition, the wavelength of the light may be changed from green to yellow by replacing Ca, La site with a material having the same oxidation number by controlling the molar ratio of the constituting elements in the phosphor of the present invention. In addition, the light emitting efficiency may be changed, and the wavelength of the emitted light may be changed according to the Eu doping concentration. Further, the phosphor of the present invention may be used as a phosphor for tuning.

MODE FOR CARRYING OUT THE INVENTION

Hereinafter, the present invention will be described in detail.

Phosphor

The phosphor according to the present invention includes a host material represented by the general formula of $(Ca_{1-x}M1_x)_a(La_{1-y}M2_y)_bSi_cN_dO_e$ (in which $0.5 \le b/a \le 7$, $1.5 \le c/(a+b) \le 3.5$, $1 \le d/c \le 1.8$, $0.6 \le e/(a+b) \le 2$, $0 \le x \le 0.5$, $0 \le y \le 0.5$) and having a monoclinic crystalline structure having a reference value of a=18.5427 Å, b=4.8404 Å, c=10.7007 Å, $\alpha=\gamma=90°$, and $\beta=108.257°$, and at least one dissolved activator selected from the group consisting of Mn, Ce, Pr, Nd, Sm, Eu, Gd, Tb, Dy, Ho, Er, Tm and Yb. The M1 is at least one element selected from Ba, Mg, Sr, Mn and Zn, and the M2 is at least one element selected from Y, Lu, Sc, Gd, Tb, Ce, Nd, Sm, Dy, Ho, Er, Tm, Yb, Al, Ga, Ge, Sn and In.

Figure 4:
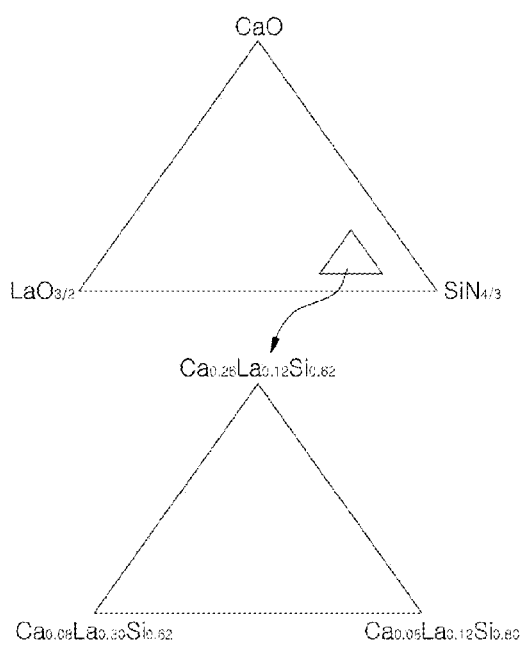
FIG. 4 is a diagram illustrating component ranges for forming a phosphor having a single phase monoclinic crystalline structure according to the present invention.

In the general formula of the phosphor according to the present invention, the relation between a, b and c may be more particularly defined by a triple element composition designating diagram in FIG. 4.

That is, the phosphor according to the present invention is an oxynitride-based phosphor mainly including Ca, La, Si, N and 0. Even though a portion of the Ca is replaced with Ba, Mg, Sr, Mn and Zn, and a portion of the La is replaced with Y, Lu, Sc, Gd, Tb and Ce, the phosphor has a monoclinic crystalline structure in which the lengths of three crystalline axes of a, b and c are different from each other, the a-axis is perpendicular to the b-axis and the c-axis, however, the b-axis and the c-axis are not perpendicular to each other. When the Eu and the like is dissolved as a central metal element for emitting light, and when the phosphor is exposed to an excitation source of ultraviolet or visible light, the phosphor composition emits green, yellowish green or yellow light.

In addition, a, b, c and β values may be changed by less than or equal to ±5% from the reference value of a=18.5427 Å, b=4.8404 Å, c=10.7007 Å, $\alpha=\gamma=90°$, and $\beta=108.257°$.

In the phosphor of the present invention, the "a" is a numerical of a proportional constant and may be any value, however, may be preferably in a range of 1 to 30 when represented by a chemical formula obtained through a subsequent accurate structure analysis. The "a" is more preferably, in a range of 1 to 10 when considering the chemical formula of a common crystalline structure.

In the phosphor of the present invention, the preferred range of "b" is 0.5a to 7a. When the "b" is less than 0.5a or exceeds 7a, the crystalline structure may change to other than the monoclinic structure, and the properties of the phosphor according to the present invention may be unobtainable. When considering the stability of the crystalline structure, the "b" is more preferably in the range of 0.8a to 2a.

In addition, in the phosphor of the present invention, the preferred range of the "c" is $1.5(a+b) \le c \le 3.5(a+b)$. When the "c" is less than 1.5(a+b) or exceeds 3.5(a+b), the crystalline structure may change to other than the monoclinic structure, and the properties of the phosphor according to the present invention may be unobtainable. When considering the stability of the crystalline structure, the "c" is more preferably, in the range of 1.8(a+b) to 3.2(a+b).

In the phosphor of the present invention, the composition of nitrogen may be roughly controlled by the "c" value, however, an accurate control may be impossible. When considering the stability of the crystalline structure, the "d" is preferably in the range of 1c≤d≤1.8c.

In the phosphor of the present invention, the composition of oxygen may be roughly controlled by the "a" value and the "b" value, however, an accurate control may be impossible. When considering the stability of the crystalline structure, the range of 0.6(a+b) e 2(a+b) is preferable.

In the phosphor of the present invention, up to 50% of Ca may be replaced with Ba, Mg, Sr, Mn or Zn. When the replacing amount exceeds 50%, a phase having the crystalline structure according to the present invention may be unobtainable. The most preferred replacing amount of Ca is up to 10%.

In the phosphor of the present invention, up to 50% of La may be replaced with Y, Lu, Sc, Gd, Tb or Ce. When the replacing amount exceeds 50%, a phase having the crystalline structure according to the present invention may be unobtainable. The most preferred replacing amount of La is up to 10%.

In the phosphor of the present invention, when the dissolved amount of the activator is less than 0.001a, the amount of the light emitting element is insufficient, and the luminance may be insufficient. When the dissolved amount exceeds 0.4a, the luminance may be rather decreased due to a concentration quenching effect. Thus, the high luminance may be obtained when the dissolved amount of the activator is 0.001a to 0.4a. More preferably, the dissolved amount of the activator is in the range of 0.03 to 0.07 molar ratio. As the activator, europium (Eu) is preferred, and at least one element selected from Mn, Ce, Pr, Nd, Sm, Gd, Tb, Dy, Ho, Er, Tm and Yb may be co-doped into the europium.

In addition, the phosphor having the composition according to the present invention preferably has a single phase. However, inevitable amount of amorphous or other crystalline phases other than the monoclinic phase may be included. A portion of a mixture including the amorphous phase or other crystalline phase may be included only when no adverse effect is generated onto the properties of the phosphor.

The mean particle size of the phosphor of the present invention is preferably 1 to 20 μm. When the mean particle size is less than 1 μm, a light absorbing ratio due to scattering may be deteriorated, and homogeneous dispersion in a resin sealing an LED may be difficult. When the mean particle size exceeds 20 μm, the light emitting intensity and the color of the phosphor may become non-uniform.

Method of Manufacturing Phosphor

A method of manufacturing the phosphor according to the present invention will be described in detail.

As raw materials for manufacturing the phosphor when using Si, Ca, La and Eu as the main components, silicon nitride ($Si_3N_4$), calcium oxide (CaO), lanthanum oxide (LaO) and europium oxide ($Eu_2O_3$) powders were used. As Ba, Mg, Sr and Mn components for replacing Ca, respective oxide powder thereof was used. As Y, Lu, Sc, Gd, Tb and Ce components for replacing La, respective oxide powder thereof was used.

Raw materials of CaO, $La_2O_3$ and a-$Si_3N_4$ were weighed and mixed to prepare in a certain composition. In this case, the amount of the mixture per sample was 1.5 g. The raw material of the activator was added by 0.04 mol with respect to Ca and La.

The mixing process of the raw materials was conducted manually for 10 minutes in an atmosphere.

A baking process of the thus prepared mixture samples was conducted in a nitrogen gas atmosphere including a nitrogen gas as a main component and 0 to 25% of a $H_2$ gas under the pressure of from an atmospheric pressure to 20 atm. Through conducting the baking under the nitrogen gas atmosphere, the decomposition of a nitride synthesized during the baking at a high temperature may be prevented or restrained, and the composition deviation of the nitride may be decreased to manufacture a phosphor composition having a good performance. Here, the inclusion of the nitrogen gas as the main component means that 75% or more of the nitrogen gas based on the total gas is included. The baking temperature is preferably in the range of 1,300° C. to 1,800° C., and is more preferably 1,500° C. or over to obtain a phosphor having a high quality. In addition, the baking time may be in a range of 30 minutes to 100 hours. When considering the quality and the productivity, the preferred baking time is 2 to 8 hours.

In an example embodiment, the baking was conducted in a high purity nitrogen gas atmosphere (99.999%) under an atmospheric pressure at 1,500° C. for 2 hours, and a pulverizing process was conducted to manufacture the phosphor.

Hereinafter, the present invention will be described in more detail referring to preferred embodiments of the present invention. The following Examples 1 to 7 are conducted to confirm the difference of light emitting properties according to the molar ratio of the activator $Eu^{2+}$, and the following Examples 8 to 10 are conducted to confirm the difference of light emitting properties when a portion of Ca is replaced with Mg, Sr and Ba, the following Examples 11 to 14 are conducted to confirm the difference of light emitting properties when a portion of La is replaced with Y, Lu, Sc, Gd and Tb, and the following Examples 15 and 16 are conducted to confirm the difference of light emitting properties when using Ce and Mn as the activator instead of Eu.

Example 1

After respectively weighing 0.2070 g of CaO, 0.6013 g of $La_2O_3$, 0.6911 g of a-$Si_3N_4$, and 0.0007 g of $Eu_2O_3$, as the raw materials of the phosphor composition of Example 1, the raw materials were manually mixed by using a mortar and pestle in an air atmosphere to obtain 1.5 g of a raw material powder mixture.

1.5 g of the thus mixed raw material powder mixture was filled in a crucible, a nitrogen gas was injected into a baking furnace to obtain a nitrogen atmosphere of 0.5 MPa pressure, and a baking treatment was conducted by heating at 1,500° C. for 6 hours. After conducting the baking treatment a pulverizing process was performed to obtain a phosphor composition. The thus obtained phosphor was confirmed to emit green light when using an excitation source of 460 nm.

Example 2

After respectively weighing 0.2053 g of CaO, 0.5964 g of $La_2O_3$, 0.6917 g of a-$Si_3N_4$, and 0.0065 g of $Eu_2O_3$, as the raw materials of the phosphor composition of Example 2, the raw materials were manually mixed by using a mortar and pestle in an air atmosphere to obtain 1.5 g of a raw material powder mixture. Then, the same procedure as described in Example 1 was conducted to obtain a phosphor composition. The thus obtained phosphor was confirmed to emit green light when using an excitation source of 460 nm.

Example 3

After respectively weighing 0.2022 g of CaO, 0.5874 g of $La_2O_3$, 0.6930 g of a-$Si_3N_4$, and 0.0174 g of $Eu_2O_3$, as the raw materials of the phosphor composition of Example 3, the raw materials were manually mixed by using a mortar and pestle in an air atmosphere to obtain 1.5 g of a raw material powder mixture. Then, the same procedure as described in Example 1 was conducted to obtain a phosphor composition. The thus obtained phosphor was confirmed to emit greenish yellow light when using an excitation source of 460 nm.

Example 4

After respectively weighing 0.1997 g of CaO, 0.5802 g of $La_2O_3$, 0.6939 g of a-$Si_3N_4$, and 0.0261 g of $Eu_2O_3$, as the raw materials of the phosphor composition of Example 4, the raw materials were manually mixed by using a mortar and pestle in an air atmosphere to obtain 1.5 g of a raw material powder mixture. Then, the same procedure as described in Example 1 was conducted to obtain a phosphor composition. The thus obtained phosphor was confirmed to emit yellow light when using an excitation source of 460 nm.

Example 5

After respectively weighing 0.1979 g of CaO, 0.5748 g of $La_2O_3$, 0.6947 g of a-$Si_3N_4$, and 0.0327 g of $Eu_2O_3$, as the raw materials of the phosphor composition of Example 5, the raw materials were manually mixed by using a mortar and pestle in an air atmosphere to obtain 1.5 g of a raw material powder mixture. Then, the same procedure as described in Example 1 was conducted to obtain a phosphor composition. The thus obtained phosphor was confirmed to emit yellow light when using an excitation source of 460 nm.

Example 6

After respectively weighing 0.1960 g of CaO, 0.5693 g of $La_2O_3$, 0.6954 g of a-$Si_3N_4$, and 0.0393 g of $Eu_2O_3$, as the raw materials of the phosphor composition of Example 6, the raw materials were manually mixed by using a mortar and pestle in an air atmosphere to obtain 1.5 g of a raw material powder mixture. Then, the same procedure as described in Example 1 was conducted to obtain a phosphor composition. The thus obtained phosphor was confirmed to emit yellow light when using an excitation source of 460 nm.

Example 7

After respectively weighing 0.1922 g of CaO, 0.5584 g of $La_2O_3$, 0.6969 g of a-$Si_3N_4$, and 0.0524 g of $Eu_2O_3$, as the raw materials of the phosphor composition of Example 7, the raw materials were manually mixed by using a mortar and pestle in an air atmosphere to obtain 1.5 g of a raw material powder mixture. Then, the same procedure as described in Example 1 was conducted to obtain a phosphor composition. The thus obtained phosphor was confirmed to emit yellow light when using an excitation source of 460 nm.

Example 8

After respectively weighing 0.1796 g of CaO, 0.5825 g of $La_2O_3$, 0.6967 g of a-$Si_3N_4$, 0.0150 g of MgO and 0.0262 g of $Eu_2O_3$, as the raw materials of the phosphor composition of Example 8, the raw materials were manually mixed by using a mortar and pestle in an air atmosphere to obtain 1.5 g of a raw material powder mixture. Then, the same procedure as described in Example 1 was conducted to obtain a phosphor composition. The thus obtained phosphor was confirmed to emit yellow light when using an excitation source of 460 nm.

Example 9

After respectively weighing 0.1768 g of CaO, 0.5735 g of $La_2O_3$, 0.6859 g of a-$Si_3N_4$, 0.0380 g of SrO, and 0.0258 g of $Eu_2O_3$, as the raw materials of the phosphor composition of Example 9, the raw materials were manually mixed by using a mortar and pestle in an air atmosphere to obtain 1.5 g of a raw material powder mixture. Then, the same procedure as described in Example 1 was conducted to obtain a phosphor composition. The thus obtained phosphor was confirmed to emit yellow light when using an excitation source of 460 nm.

Example 10

After respectively weighing 0.1747 g of CaO, 0.5666 g of $La_2O_3$, 0.6776 g of a-$Si_3N_4$, 0.0556 g of BaO, and 0.0255 g of $Eu_2O_3$, as the raw materials of the phosphor composition of Example 10, the raw materials were manually mixed by using a mortar and pestle in an air atmosphere to obtain 1.5 g of a raw material powder mixture. Then, the same procedure as described in Example 1 was conducted to obtain a phosphor composition. The thus obtained phosphor was confirmed to emit yellow light when using an excitation source of 460 nm.

Example 11

After respectively weighing 0.1764 g of CaO, 0.5722 g of $La_2O_3$, 0.6843 g of a-$Si_3N_4$, 0.0413 g of $Y_2O_3$, and 0.0258 g of $Eu_2O_3$, as the raw materials of the phosphor composition of Example 11, the raw materials were manually mixed by using a mortar and pestle in an air atmosphere to obtain 1.5 g of a raw material powder mixture. Then, the same procedure as described in Example 1 was conducted to obtain a phosphor composition. The thus obtained phosphor was confirmed to emit yellow light when using an excitation source of 460 nm.

Example 12

After respectively weighing 0.1754 g of CaO, 0.5687 g of $La_2O_3$, 0.6802 g of a-$Si_3N_4$, 0.0501 g of $Sc_2O_3$, and 0.0256 g of $Eu_2O_3$, as the raw materials of the phosphor composition of Example 12, the raw materials were manually mixed by using a mortar and pestle in an air atmosphere to obtain 1.5 g of a raw material powder mixture. Then, the same procedure as described in Example 1 was conducted to obtain a phosphor composition. The thus obtained phosphor was confirmed to emit greenish yellow light when using an excitation source of 460 nm.

Example 13

After respectively weighing 0.1736 g of CaO, 0.5628 g of $La_2O_3$, 0.6731 g of a-$Si_3N_4$, 0.0652 g of $Gd_2O_3$, and 0.0253 g of $Eu_2O_3$, as the raw materials of the phosphor composition of Example 13, the raw materials were manually mixed by using a mortar and pestle in an air atmosphere to obtain 1.5 g of a raw material powder mixture. Then, the same procedure as described in Example 1 was conducted to obtain a phosphor composition. The thus obtained phosphor was confirmed to emit yellow light when using an excitation source of 460 nm.

Example 14

After respectively weighing 0.1733 g of CaO, 0.5620 g of $La_2O_3$, 0.6722 g of a-$Si_3N_4$, 0.0672 g of $Tb_4O_7$, and 0.0253 g of $Eu_2O_3$, as the raw materials of the phosphor composition of Example 14, the raw materials were manually mixed by using a mortar and pestle in an air atmosphere to obtain 1.5 g of a raw material powder mixture. Then, the same procedure as described in Example 1 was conducted to obtain a phosphor composition. The thus obtained phosphor was confirmed to emit yellow light when using an excitation source of 460 nm.

Example 15

After respectively weighing 0.1897 g of CaO, 0.5906 g of $La_2O_3$, 0.6781 g of a-$Si_3N_4$, and 0.0416 g of $CeO_2$, as the raw materials of the phosphor composition of Example 15, the raw materials were manually mixed by using a mortar and pestle in an air atmosphere to obtain 1.5 g of a raw material powder mixture. Then, the same procedure as described in Example 1 was conducted to obtain a phosphor composition. The thus obtained phosphor was confirmed to emit blue light when using an excitation source of 400 nm.

Example 16

After respectively weighing 0.1982 g of CaO, 0.5757 g of $La_2O_3$, 0.7082 g of a-$Si_3N_4$, and 0.0179 g of MnO, as the raw materials of the phosphor composition of Example 16, the raw materials were manually mixed by using a mortar and pestle in an air atmosphere to obtain 1.5 g of a raw material powder mixture. Then, the same procedure as described in Example 1 was conducted to obtain a phosphor composition. The thus obtained phosphor was confirmed to emit blue light when using an excitation source of 400 nm.

The mixing ratios of the raw materials and the light emitting properties according to Examples 1 to 16 are summarized in the following Table 1.

is a diagram illustrating an XRD analysis result on the phosphors manufactured according to Examples 8 to 14 of the present invention when Ca or La is replaced with Mg, Sr, Ba, Y, Sc, Gd or Tb in a host material by about 10%, along with that according to Example 4.

Figure 1:
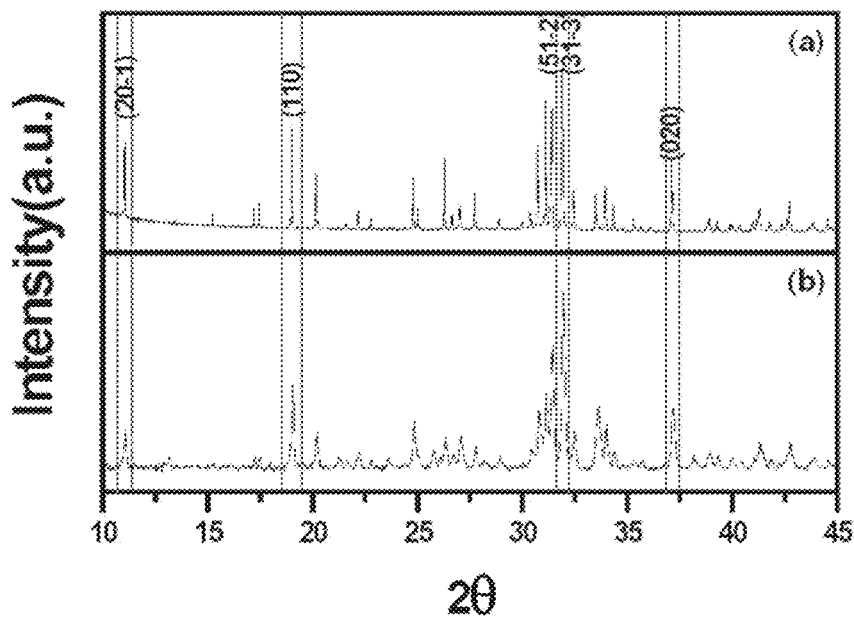
FIG. 1A is a diagram illustrating a precise XRD analysis result of a phosphor manufactured according to Example 4 of the present invention by using an accelerator light source.
FIG. 1B is a diagram illustrating an analysis result of a phosphor manufactured according to Example 4 of the present invention by using a common XRD analysis apparatus.

As confirmed in FIGS. 1A and 1B, representative diffraction peaks are illustrated in the ranges of Bragg angles (2θ) of 10.68° to 11.41°, 18.52° to 19.46°, 31.58° to 31.21° and 36.81° to 37.49° (the ranges sectioned by vertical lines in FIGS. 1A and 1B) for the phosphor manufactured according to Example 4 of the present invention. The representative diffraction peaks have relative intensity of greater than or equal to 5% when the relative intensity of the most intensive diffraction peak in a powder X-ray diffraction pattern is 100%.

Figure 2:
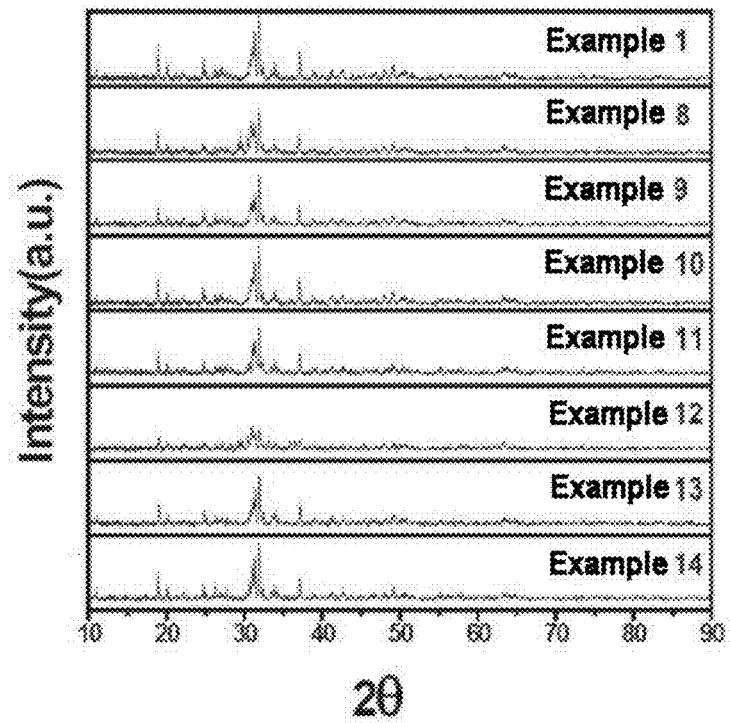
FIG. 2 is a diagram illustrating an XRD analysis result on the phosphors manufactured according to Examples 8 to 14 of the present invention when Ca or La is replaced with Mg, Sr, Ba, Y, Sc, Gd or Tb in a host material by about 10%, with respect to that according to Example 4.
Figure 3:
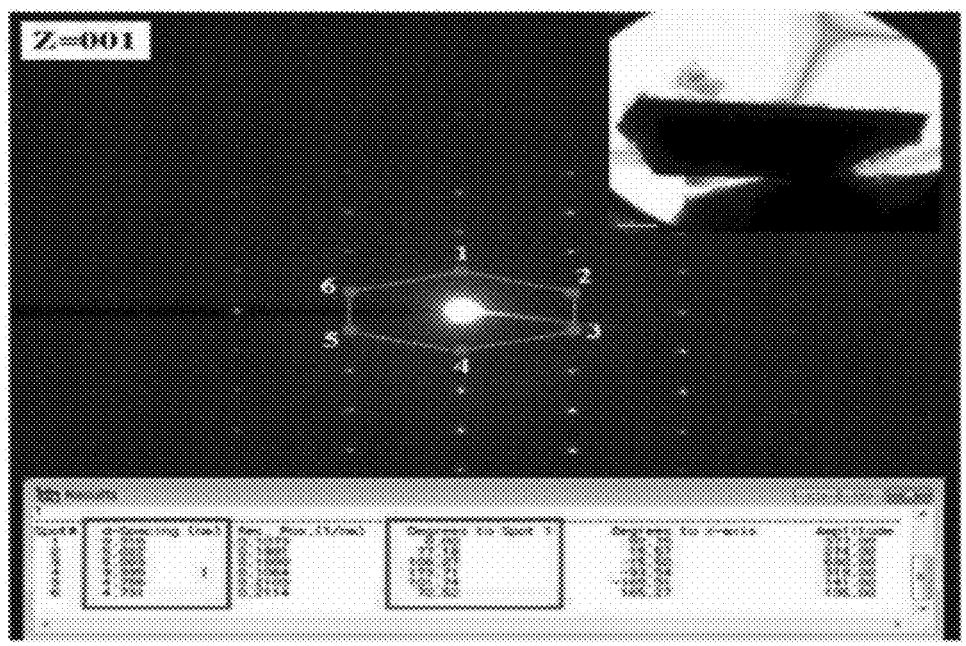
FIG. 3 is a diagram illustrating a TEM analysis result on the phosphor manufactured according to Example 4 of the present invention.

As confirmed in FIG. 2, the phosphors according to Examples 8 to 14 of the present invention obtained by replacing Ca or La with Mg, Sr, Ba, Y, Sc, Gd, or Tb, have substantially the same crystalline structure as that of the phosphor according to Example 4 and illustrate little change. When the amount of the replacing component is increased and exceeds 50%, the composition having the monoclinic crystalline structure according to the present invention may be unobtainable. Meanwhile, when considering the stability of the crystalline structure, the replacing amount of the above-described elements is preferably less than or equal to 10%.

In addition, from the profile matching using the analysis results of the synchrotron powder XRD, the crystalline lattice

TABLE 1

| | Raw material composition | | | | | | | |
|---|---|---|---|---|---|---|---|---|
| | | | | Addition | | Activator | | |
| Example | CaO (g) | $La_2O_3$ (g) | $Si_3N_4$ (g) | Material | Mixing amount (g) | Material | Mixing amount (g) | Molar ratio (%) | Light emitting color |
| 1 | 0.2070 | 0.6013 | 0.6911 | — | — | $Eu_2O_3$ | 0.0007 | 0.001 | Green |
| 2 | 0.2053 | 0.5964 | 0.6917 | — | — | $Eu_2O_3$ | 0.0065 | 0.01 | Green |
| 3 | 0.2022 | 0.5874 | 0.6930 | — | — | $Eu_2O_3$ | 0.0174 | 0.02 | Greenish yellow |
| 4 | 0.1997 | 0.5802 | 0.6939 | — | — | $Eu_2O_3$ | 0.0261 | 0.04 | Yellow |
| 5 | 0.1979 | 0.5748 | 0.6947 | — | — | $Eu_2O_3$ | 0.0327 | 0.05 | Yellow |
| 6 | 0.1960 | 0.5693 | 0.6954 | — | — | $Eu_2O_3$ | 0.0393 | 0.06 | Yellow |
| 7 | 0.1922 | 0.5584 | 0.6969 | — | — | $Eu_2O_3$ | 0.0524 | 0.08 | Yellow |
| 8 | 0.1796 | 0.5825 | 0.6967 | MgO | 0.0150 | $Eu_2O_3$ | 0.0262 | 0.04 | Yellow |
| 9 | 0.1768 | 0.5735 | 0.6859 | SrO | 0.0380 | $Eu_2O_3$ | 0.0258 | 0.04 | Yellow |
| 10 | 0.1747 | 0.5666 | 0.6776 | BaO | 0.0556 | $Eu_2O_3$ | 0.0255 | 0.04 | Yellow |
| 11 | 0.1764 | 0.5722 | 0.6843 | $Y_2O_3$ | 0.0413 | $Eu_2O_3$ | 0.0258 | 0.04 | Yellow |
| 12 | 0.1754 | 0.5687 | 0.6802 | $Sc_2O_3$ | 0.0501 | $Eu_2O_3$ | 0.0256 | 0.04 | Greenish yellow |
| 13 | 0.1736 | 0.5628 | 0.6731 | $Gd_2O_3$ | 0.0652 | $Eu_2O_3$ | 0.0253 | 0.04 | Yellow |
| 14 | 0.1733 | 0.5620 | 0.6722 | $Tb_4O_7$ | 0.0672 | $Eu_2O_3$ | 0.0253 | 0.04 | Yellow |
| 15 | 0.1897 | 0.5906 | 0.6781 | — | — | $CeO_2$ | 0.0416 | — | Blue |
| 16 | 0.1982 | 0.5757 | 0.7082 | — | — | MnO | 0.0179 | — | blue |

In addition, the crystalline structures of the phosphor compositions according to Examples 4, and 8 to 14 of the present invention were analyzed through an XRD and TEM. After conducting the XRD analysis, a precise X-ray diffraction analysis was conducted by using a synchrotron radiation X-ray diffraction (SR-XRD) with respect to the phosphor manufactured according to Example 4.

FIG. 1A is a diagram illustrating a synchrotron radiation X-ray diffraction (SR-XRD) analysis result of a phosphor manufactured according to Example 4 of the present invention, and FIG. 1B is an analysis result of a phosphor manufactured according to Example 4 of the present invention by using a common XRD analysis apparatus. In addition, FIG. 2 of the phosphor according to Example 4 of the present invention is a=18.5427 Å, b=4.8404 Å, c=10.7007 Å, α=γ=90°, β=108.257°. The host material of the phosphor was confirmed to have a monoclinic crystalline structure. In addition, the analysis results of the crystalline structure by using TEM SAED in FIG. 5 also support the above analyzed result. The phosphor having the above described crystalline structure is novel and unknown until now.

In the following Table 2, the profile matching results of the XRD analysis result on the phosphors according to Examples 1 to 16 of the present invention are illustrated. Among them, Example 4 corresponds to the synchrotron powder XRD analysis result, and the remaining results correspond to XRD analysis results conducted in a laboratory.

TABLE 2

| Example | a-axis (Å) | b-axis (Å) | c-axis (Å) | β angle (°) |
|---|---|---|---|---|
| 1 | 18.5588 | 4.8448 | 10.7105 | 108.257 |
| 2 | 18.5320 | 4.8405 | 10.6968 | 108.260 |
| 3 | 18.5150 | 4.8358 | 10.6764 | 108.175 |
| 4 | 18.5427 | 4.8404 | 10.7007 | 108.257 |
| 5 | 18.5300 | 4.8358 | 10.6860 | 108.197 |
| 6 | 18.5020 | 4.8217 | 10.6700 | 108.234 |
| 7 | 18.5400 | 4.8247 | 10.6790 | 108.204 |
| 8 | 18.4880 | 4.8297 | 10.6694 | 108.200 |
| 9 | 18.4820 | 4.8303 | 10.6640 | 108.251 |
| 10 | 18.5060 | 4.8260 | 10.6870 | 108.258 |
| 11 | 18.5340 | 4.8412 | 10.6771 | 108.143 |
| 12 | 18.5320 | 4.8380 | 10.7030 | 108.053 |
| 13 | 18.5380 | 4.8415 | 10.6961 | 108.269 |
| 14 | 18.5410 | 4.8409 | 10.6900 | 108.126 |
| 15 | 18.5290 | 4.8363 | 10.6897 | 108.247 |
| 16 | 18.5190 | 4.8366 | 10.6940 | 108.327 |

As confirmed from Table 2, for the phosphors according to Examples 1 to 3 and 5 to 16 of the present invention, when considering a=18.5427 Å, b=4.8404 Å, c=10.7007 Å, α=γ=90°, and β=108.257° as a reference value (Example 4), the changes of a, b, c and β value from the reference value is less than or equal to ±5%.

In addition, the inner triangle in FIG. 4 represents the composition range among the amounts of Ca, La and Si for obtaining a single phase having a monoclinic crystalline structure according to the present invention through experiments by the present inventors. When the composition range deviates from the given composition range, the single phase having the crystalline structure as the phosphor according to the examples of the present invention may be unobtainable.

Figure 5:
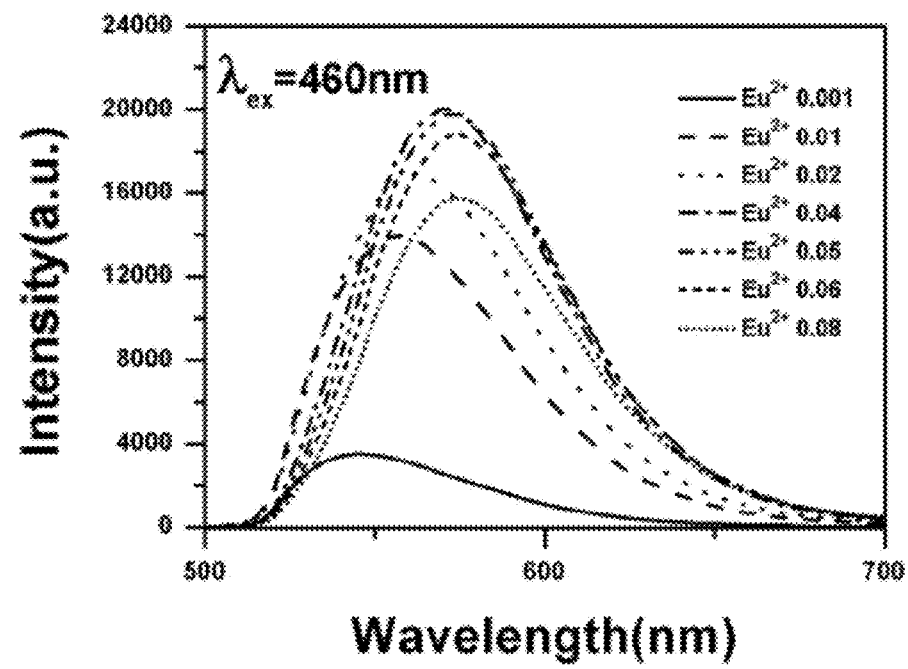
FIG. 5 is a diagram illustrating the light emitting properties of phosphors including different $Eu^{2-}$ doping amounts according to Examples 1 to 7 of the present invention.
Figure 6:
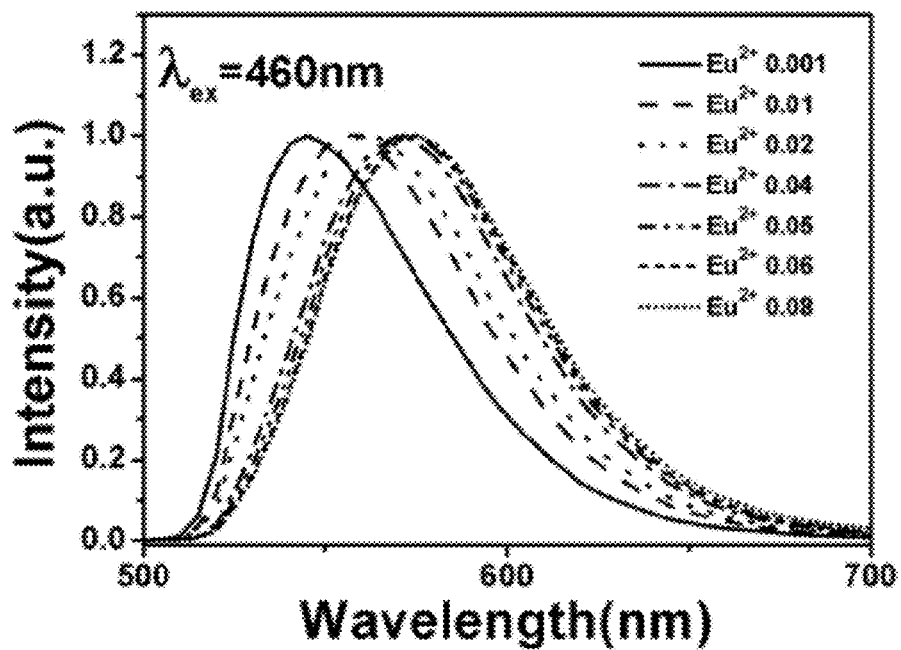
FIG. 6 is a diagram illustrating a normalized result on the intensity in FIG. 5.

FIGS. 5 and 6 are diagrams illustrating the difference in light emitting properties of the phosphors according to Examples 1 to 7 of the present invention including different $Eu^{2+}$ doping amount in the same host material. FIG. 5 illustrates the relative intensity of the luminescence and FIG. 6 illustrates the normalized result of the intensity.

As confirmed from FIG. 5, the luminance is very low when the $Eu^{2+}$ doping amount is 0.001 in a molar ratio, is good when $Eu^{2-}$ doping amounts are 0.04, 0.05 and 0.06, and is the best when $Eu^{2+}$ doping amount is 0.04. Thus, the most preferable $Eu^{2+}$ doping amount are 0.03 to 0.07. In addition, as confirmed in FIG. 6, the light emitting peak gradually shifts to a longer wavelength region according to the $Eu^{2+}$ doping amount, and various light emitting colors from greenish yellow to dark yellow may be obtained according to the change of the $Eu^{2+}$ doping amount.

Figure 7:
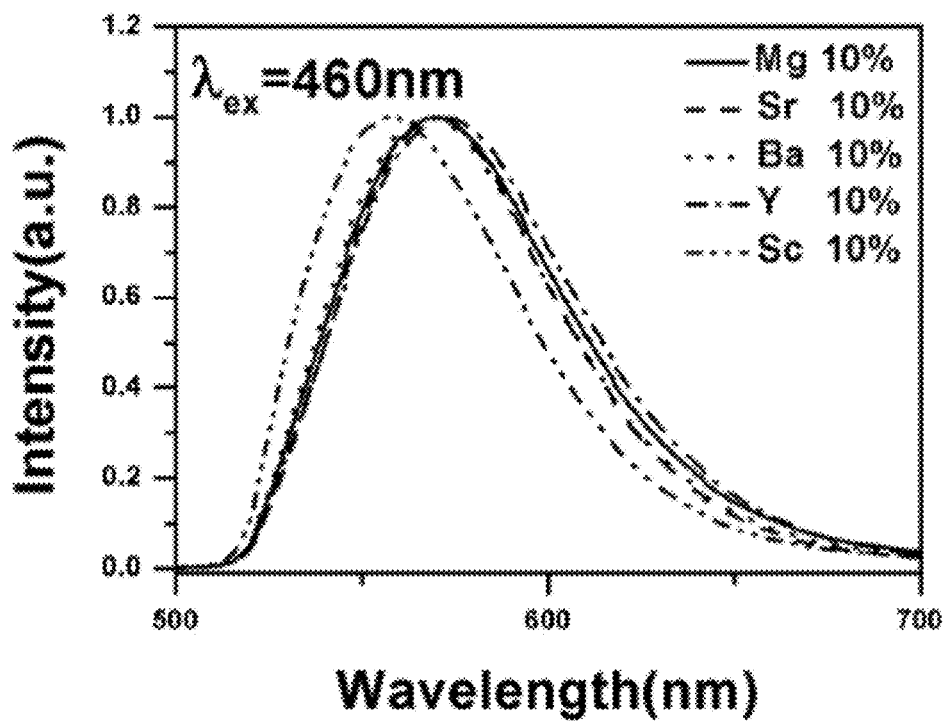
FIG. 7 is a diagram illustrating light emitting properties of the phosphors manufactured according to Examples 8 to 14 according to the present invention.

FIG. 7 is a diagram illustrating light emitting properties of the phosphors manufactured according to Examples 8 to 14 of the present invention and illustrates normalized results. As confirmed in FIG. 7, the peak wavelength was 550 to 560 nm and illustrated yellow color when the same $Eu^{2+}$ was used as the activator. The peak wavelength difference according to the replacing materials was not found.

Figure 8:
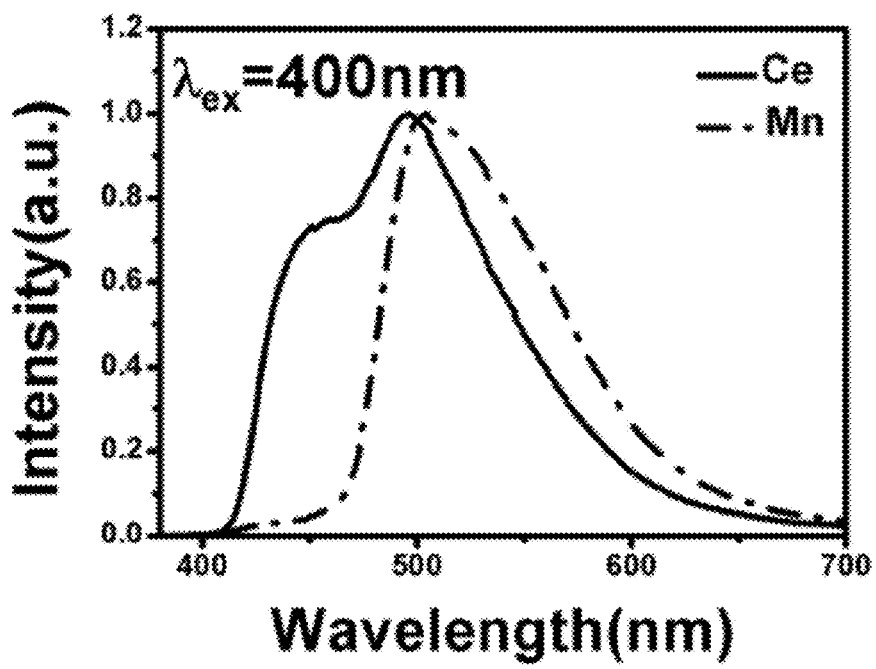
FIG. 8 is a diagram illustrating the light emitting properties of phosphors manufactured according to Examples 15 and 16 of the present invention.

FIG. 8 is a diagram illustrating the light emitting properties of the phosphors manufactured according to Examples 15 and 16 of the present invention and illustrates normalized results.

As confirmed in FIG. 8, the peak wavelength was illustrated at near about 500 nm when exposed to an excitation source of 400 nm and illustrated blue color when Ce or Mn was used as the activator.

From the above-described results, the phosphor composition of the present invention is found to emit wide range of light from blue to yellow according to the kind of the activator or the control of the amount of the activator. Particularly, the phosphor may be appropriately used as yellow phosphor.

The invention claimed is:
1. An oxynitride-based phosphor, comprising;
   a host material represented by $(Ca_{1-x}M1_x)_a(La_{1-y}M2_y)_b Si_c N_d O_e$, wherein,
   b/a ranges 0.5 to 7,
   c/(a+b) ranges 1.5 to 3.5,
   d/c ranges 1 to 1.8,
   e/(a+b) ranges 0.6 to 2,
   x ranges 0 to 0.5, and
   y ranges 0 to 0.5,
   the host material has a monoclinic crystalline structure; and
   at least one dissolved activator selected from the group consisting of Mn, Ce, Pr, Nd, Sm, Eu, Gd, Dy, Tb, Ho, Er, Tm and Yb, wherein,
   M1 being at least one element selected from Ba, Mg, Sr, Mn and Zn, and
   M2 being at least one element selected from Y, Lu, Sc, Gd, Tb, Ce, Nd, Sm, Dy, Ho, Er, Tm, Yb, Al, Ga, Ge, Sn and In,
   wherein the host material comprises a phase illustrating diffraction peaks in ranges of Bragg angles (2θ) of 10.68° to 11.41°, 18.52° to 19.46°, 31.58° to 31.21° and 36.81° to 37.49°, as a representative phase, and the diffraction peaks have relative intensity of greater than or equal to 5% when the relative intensity of the most intensive diffraction peak in a powder X-ray diffraction pattern is 100%, a crystalline structure of the representative phase being monoclinic.

2. The oxynitride-based phosphor of claim 1, wherein the host material has a reference value of a crystalline lattice according to peaks of the powder X-ray diffraction pattern of a=18.5427 Å, b=4.8404 Å, c=10.7007 Å, α=γ=90°, β=108.257°,
   changes of a, b, c and β values from the reference value being less than or equal to ±5%.

3. The oxynitride-based phosphor of claim 1, wherein the a is 1 to 30, the b is 0.8a to 2a, and the c is 1.8(a+b) to 3.2(a+b).

4. The oxynitride-based phosphor of claim 1, wherein the activator comprises Eu.

5. The oxynitride-based phosphor of claim 1, wherein the x is 0 to 0.1 and the y is 0 to 0.1.

6. The oxynitride-based phosphor of claim 1, wherein the activator is included by a molar ratio of 0.005 to 0.1.

7. The oxynitride-based phosphor of claim 1, wherein the phosphor emits light in a wavelength range of 500 to 600 nm by a radiation of an excitation source of 360 to 500 nm wavelength.

* * * * *